US009150954B2

(12) United States Patent
Lee et al.

(10) Patent No.: US 9,150,954 B2
(45) Date of Patent: Oct. 6, 2015

(54) LIGHT-EMITTING DIODE AND DEPOSITION APPARATUS FOR FABRICATING THE SAME

(71) Applicant: LG DISPLAY CO., LTD., Seoul (KR)

(72) Inventors: Se-Hee Lee, Gyeongsangbuk-do (KR); Sun-Kap Kwon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/661,265

(22) Filed: Oct. 26, 2012

(65) Prior Publication Data

US 2013/0105843 A1 May 2, 2013

(30) Foreign Application Priority Data

Oct. 28, 2011 (KR) .................. 10-2011-0110936
Dec. 12, 2011 (KR) .................. 10-2011-0132753

(51) Int. Cl.
| | | |
|---|---|---|
| H01L 51/54 | (2006.01) | |
| C23C 14/24 | (2006.01) | |
| H01L 51/50 | (2006.01) | |
| C23C 14/50 | (2006.01) | |
| C23C 14/54 | (2006.01) | |
| H01L 51/52 | (2006.01) | |
| H01L 51/56 | (2006.01) | |

(52) U.S. Cl.
CPC .............. C23C 14/24 (2013.01); C23C 14/50 (2013.01); C23C 14/542 (2013.01); H01L 51/5012 (2013.01); H01L 51/5036 (2013.01); H01L 51/5265 (2013.01); *H01L 51/5218* (2013.01); *H01L 51/56* (2013.01)

(58) Field of Classification Search
CPC ............ H01L 51/5004; H01L 51/5024; H01L 51/5036
See application file for complete search history.

(56) References Cited

U.S. PATENT DOCUMENTS

| 6,917,159 B2 * | 7/2005 | Tyan et al. ................. 313/506 |
| 7,906,901 B2 * | 3/2011 | Fujita et al. ............... 313/504 |
| 2005/0037232 A1 | 2/2005 | Tyan et al. |

FOREIGN PATENT DOCUMENTS

| JP | 2007-239098 A | 9/2007 |
| WO | 2010/082755 A2 | 7/2010 |

OTHER PUBLICATIONS

Freeman, Adam W. et al., 'Dendrime-containing light-emitting diodes: Toward site-isolation of chromophores,' 2000 J. Am. Chem. Soc. vol. 122, No. 49, pp. 12385-12386.*

(Continued)

*Primary Examiner* — Bryan Junge
(74) *Attorney, Agent, or Firm* — Morgan, Lewis & Bockius LLP

(57) ABSTRACT

There is provided a light-emitting diode including: a first electrode including a reflective metal layer and a transparent conductive material layer formed on the reflective metal layer; an emitting material layer formed on the first electrode and including a light-emitting layer formed with a host and first and second dopants; and a second electrode formed on the emitting material layer and being a semi-transparent electrode, wherein a first wavelength corresponding to a peak value of a photo luminescence (PL) spectrum of the first dopant is shorter than a second wavelength corresponding to a peak value of an electro luminescence (EL) spectrum of the first dopant, and a third wavelength corresponding to a peak value of a PL spectrum of the second dopant is longer than a fourth wavelength corresponding to a peak value of an EL spectrum of the second dopant.

2 Claims, 11 Drawing Sheets

(56) References Cited

OTHER PUBLICATIONS

Office Action dated Apr. 19, 2014 from the Korean Intellectual Property Office in counterpart Korean application No. 10-2011-0132753.

First Notification of Office Action dated Jan. 30, 2015 from The State Intellectual Property Office of China in counterpart Chinese application No. 201210417447.X.

* cited by examiner

LIGHT-EMITTING DIODE AND DEPOSITION APPARATUS FOR FABRICATING THE SAME

The present application claims the priority benefit of Korean Patent Application No. 10-2011-0110936 filed in the Republic of Korea on Oct. 28, 2011 and Korean Patent Application No. 10-2011-0132753 filed in the Republic of Korea on Dec. 12, 2011, which are hereby incorporated by reference in their entirety.

BACKGROUND

1. Field of the Disclosure

The present disclosure relates to an organic light emitting display (OLED) device, and more particularly, to a light-emitting diode and a deposition apparatus for fabricating the same.

2. Discussion of the Related Art

Recently, a slim, light-weight, flat panel display having low power consumption has been developed and applied to various technical fields.

In an organic light-emitting display (OLED) device, charges are injected into a light-emitting layer formed between a cathode electrode which is an electron injection electrode, and an anode electrode which is a hole injection electrode to form electron-hole pairs, and light is emitted when the electron-hole pairs disappear. The OLED device, which can be formed on a flexible substrate such as a plastic substrate, provides excellent colors because it is a self-emitting type device, and also has low power consumption since it can be driven at a low voltage (below 10 V).

Since the OLED device, unlike a liquid crystal display (LCD) or a plasma display panel (PDP) device, can be manufactured by a very simple manufacturing process, a deposition apparatus and an encapsulation apparatus are the only manufacturing apparatuses required for manufacturing the OLED device.

Specifically, in an active matrix type, since the voltage for controlling current that is applied to pixels is charged in a storage capacitor to maintain a constant voltage until a next frame signal is applied, a light-emitted state is maintained while a screen is displayed, regardless of the number of gate lines. This operation is described with reference to FIG. 1, below.

FIG. 1 is a circuit diagram showing a sub-pixel area SP of a conventional OLED device.

As shown in FIG. 1, in the OLED device, gate lines GL, data lines DL, and power lines PL are arranged in a manner to cross each other, thereby defining a plurality of sub-pixel areas SPs, and in each sub-pixel area SP, a switching thin film transistor Ts, a driving thin film transistor Td, a storage capacitor Cst, and a light-emitting diode Del are formed.

The switching thin film transistor Ts is connected to a gate line GL and a data line DL, the driving thin film transistor Td and the storage capacitor Cst are connected between the switching thin film transistor Ts and a power line PL, and the light-emitting diode Del is connected to the driving thin film transistor Td.

When the OLED device displays an image, the switching thin film transistor Ts is turned on according to a gate signal applied to the gate line GL, and a data signal applied to the data line DL is applied to the gate electrode of the driving thin film transistor Td and one electrode of the storage capacitor Cst through the switching thin film transistor Ts.

The driving thin film transistor Td is turned on according to the data signal, and as a result, a current proportional to the data signal flows from the power line PL to the light-emitting diode Del through the driving thin film transistor Td, so that the light-emitting diode Del emits light with luminescence proportional to the current flowing through the driving thin film transistor Td.

At this time, the storage capacitor Cst is charged with a voltage proportional to the data signal to maintain the voltage of the gate electrode of the driving thin film transistor Td constant during one frame.

Accordingly, the OLED device can display a desired image using a gate signal and a data signal.

The light-emitting diode Del includes a first electrode connected to the driving thin film transistor Td, a second electrode that is opposite to the first electrode, and an organic light-emitting layer positioned between the first and second electrodes. For example, the first electrode may be an anode electrode, and the second electrode may be a cathode electrode.

The OLED device may be classified into a red light-emitting diode, a green light-emitting diode, and a blue light-emitting diode according to light-emitting patterns of red, green, and blue colors.

A light-emitting material for a general light-emitting diode may be made of a host and a dopant.

A general light-emitting diode is described with reference to FIG. 2, below. FIG. 2 is a cross-section view of a general red light-emitting diode RLE.

As shown in FIG. 2, the red light-emitting diode RLE includes an organic light-emitting layer positioned between an anode electrode 1 and a cathode electrode 7. The organic light-emitting layer includes an emitting material layer (EML) 4 disposed between the anode electrode 1 and the cathode electrode 7, a hole transporting layer (HTL) 3 disposed between the anode electrode 1 and the emitting material layer 4 to inject holes from the anode electrode 1 and electrons from the cathode electrode 7 into the emitting material layer 4, and an electron transporting layer (ETL) 5 disposed between the cathode electrode 7 and the emitting material layer 4. Also, in order to efficiently inject holes and electrons, a hole injecting layer (HIL) 2 is disposed between the anode electrode 1 and the hole transporting layer 3, and an electron injecting layer (EIL) 6 is disposed between the electron transporting layer 5 and the cathode electrode 7.

The emiting material layer (EML) 4 is formed of a host ho and a dopant do.

Lately, in order to obtain high luminous efficiency with a low voltage, a short-wavelength light-emitting material is used as the dopant do.

The short-wavelength light-emitting material means a light-emitting material in which a wavelength of the peak value of its electro luminescence (EL) spectrum is longer than a wavelength of the peak value of its photo luminescence (PL) spectrum. The EL spectrum represents intensity with respect to wavelengths of light emitted from a light-emitting material that emits light by electricity, for example, the EL spectrum represents intensity with respect to wavelengths of light emitted when electricity is applied between the anode electrode 1 and the cathode electrode 7. The PL spectrum represents intensity with respect to wavelengths of light emitted from a light-emitting material that emits light by light stimulus from the outside.

However, when such a short-wavelength light-emitting material is used as the dopant do, the following problems are generated.

The problems are described with reference to FIGS. 3A, 3B, and 3C, below. FIGS. 3A, 3B, and 3C are simulation results showing problems when a red short-wavelength light-emitting material is used as a dopant, wherein FIG. 3A is a graph showing changes in luminance with respect to viewing angles of light-emitting materials corresponding to red, green, blue, and white colors, respectively, FIG. 3B is a graph showing color changes with respect to viewing angles of the light-emitting materials corresponding to red, green, blue, and white colors, respectively, and FIG. 3C is a graph showing changes in luminance with respect to viewing angles of white color.

First, changes in luminance with respect to viewing angles are described.

As shown in FIG. 3A, in the cases of green (G), blue (B), and white (W) light-emitting materials, as a viewing angle increases, luminance decreases gradually. However, in the case of a short-wavelength red (R) light-emitting material, luminance increases according to an increase of a viewing angle until the viewing angle reaches about 40°, and after the viewing angle exceeds 40°, luminance decreases according to an increase of the viewing angle. In other words, the short-wavelength red (R) light-emitting material shows different changes in luminance with respect to viewing angles from the green (G), blue (B), and white (W) light-emitting materials.

Now, color changes Δu'v' with respect to viewing angles are described with reference to FIG. 3B.

As shown in FIG. 3B, likewise, the red (R) light-emitting material shows different color changes with respect to viewing angles from the other color light-emitting materials. In detail, the short-wavelength red (R) light-emitting material used as a dopant shows a significantly high color change of about 0.120 at a left/right viewing angle of 60°.

Meanwhile, the green (G), blue (B), and white (W) light-emitting materials show color changes in a range from about 0.020 to about 0.040.

Next, in the case of the red (R) light-emitting material, changes in luminance with respect to viewing angles of white color are described with reference to FIG. 3C.

First, in a color coordinator, white shows a good change in luminance with respect to viewing angles as it moves in a left and down direction.

At this time, a change in luminance of white according to viewing angles of a light-emitting material including a short-wavelength dopant moves in a right and up direction, and then moves in a left and up direction while making a curve. In other words, a light-emitting material including a short-wavelength dopant shows a poor change in luminance of white according to viewing angles.

As described above, a red light-emitting diode RLE uses a short-wavelength dopant in order to increase luminous efficiency, however, the short-wavelength dopant causes problems of deterioration of viewing angle properties, deterioration of color change properties, and a sharp change in luminance.

Meanwhile, referring again to FIG. 2, the organic light-emitting layer is formed by a thermal deposition method of heating a source material in a chamber, and depositing the source material on a target.

FIG. 4 shows a deposition apparatus that has been used in a conventional thermal deposition method. Referring to FIG. 4, a source is disposed on the bottom of the deposition apparatus, and a substrate 20 is positioned above the source 10 while spaced by a first distance d1 from the source 10. The substrate 20 is rotated in the state that the locations of the source 10 and the substrate 20 are fixed, and when the source is heated, a source material is deposited on the substrate 20.

In order to deposit the source material on only a part of the substrate 20, a mask 30 having a plurality of openings 32 may be used.

According to the thermal deposition method described above, the first distance d1 between the substrate 20 and the source 10 needs to be far enough to deposit the source material on the entire area of the substrate 20. However, this became a factor of increasing the size of vacuum thermal evaporation equipment. Furthermore, due to the long distance between the substrate 20 and the source 10, a large amount of source material remains on the side walls of the vacuum thermal evaporation equipment, which causes a waste of substance.

SUMMARY OF THE INVENTION

Accordingly, the present invention is directed to a display device that substantially obviates one or more of the problems due to limitations and disadvantages of the related art.

An object of the present disclosure is to provide an organic light-emitting display (OLED) device, capable of obtaining high luminous efficiency and an excellent viewing angle by overcoming problems of deterioration of viewing angle properties, deterioration of color change properties, and a sharp change in luminance of a short-wavelength red light-emitting material, and a manufacturing method of the OLED device.

Another object of the present disclosure is to overcome problems of an increase in size of a deposition apparatus and of waste of organic thin film substances.

Another object of the present invention is to overcome a problem of deterioration of device properties due to a non-uniform organic material layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a light-emitting diode including: a first electrode including a reflective metal layer and a transparent conductive material layer formed on the reflective metal layer; an emitting material layer formed on the first electrode and including a light-emitting layer formed with a host and first and second dopants; and a second electrode formed on the emitting material layer and being a semi-transparent electrode, wherein a first wavelength corresponding to a peak value of a photo luminescence (PL) spectrum of the first dopant is shorter than a second wavelength corresponding to a peak value of an electro luminescence (EL) spectrum of the first dopant, and a third wavelength corresponding to a peak value of a PL spectrum of the second dopant is longer than a fourth wavelength corresponding to a peak value of an EL spectrum of the second dopant.

In another aspect, there is provided a light-emitting diode including: a first electrode including a reflective metal layer and a transparent conductive material layer formed on the reflective metal layer; an emitting material layer formed on the first electrode and including a light-emitting layer formed with a host and first and second dopants; and a second electrode formed on the emitting material layer and being a semi-transparent electrode, wherein a third wavelength corresponding to an intermediate wavelength between a first wavelength corresponding to a peak value of a photo luminescence (PL) spectrum of the first dopant and a second wavelength corresponding to a peak value of a PL spectrum of the second dopant is defined, and the first wavelength of the first dopant is shorter than the third wavelength, and the second wavelength of the second dopant is longer than the third wavelength.

In another aspect, there is provided a deposition apparatus for fabricating a light-emitting diode, including: a chamber having an internal space; a substrate support disposed in the upper space of the chamber and configured to support a substrate; a first furnace disposed in the lower space of the chamber and storing a first source, the first furnace positioned perpendicular to a surface of the substrate; a second furnace disposed in one side of the first furnace in the lower space of the chamber and storing a second source, the second furnace positioned to have a first angle with respect to the surface of the substrate; and a third furnace disposed in the other side of the first furnace in the lower space of the chamber and storing a third source, the third furnace positioned to have a second angle with respect to the surface of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 5:
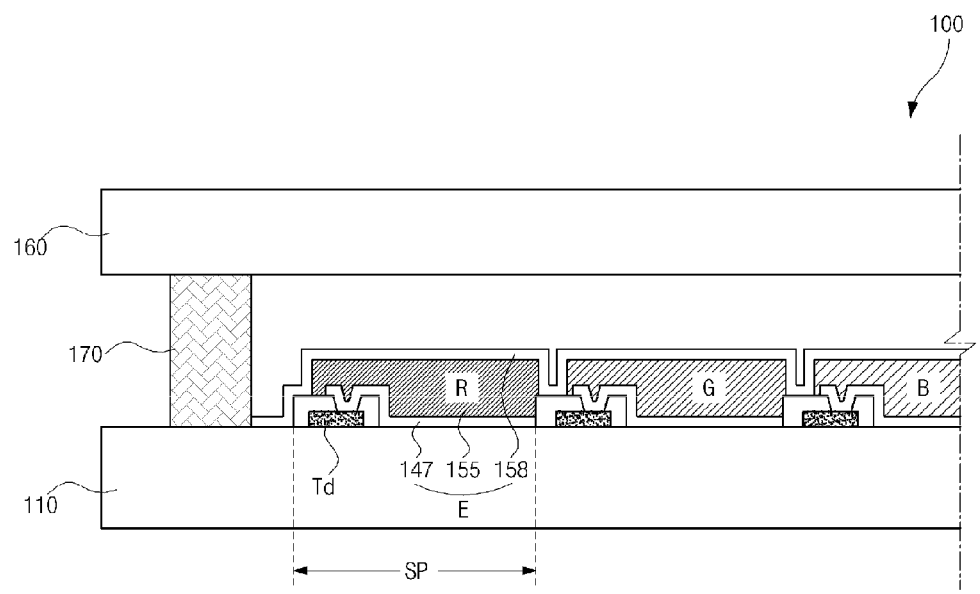
FIG. 5 is a schematic cross-sectional view of an OLED device.
Figure 6:
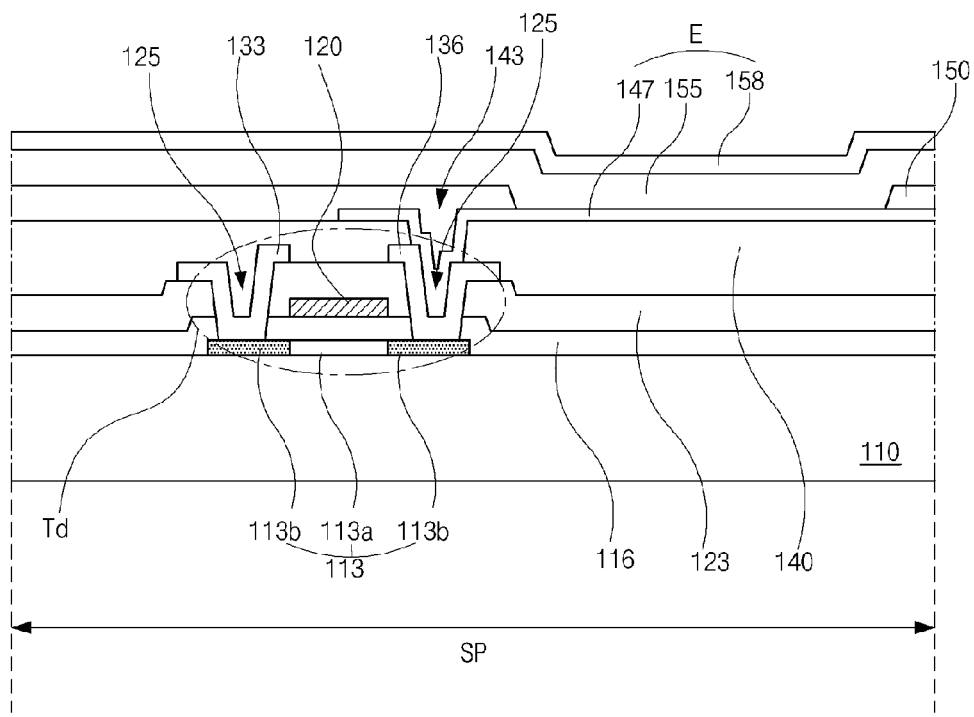
FIG. 6 is a schematic cross-sectional view of a pixel area including a driving thin film transistor.

Referring to FIG. 5 which is a schematic cross-sectional view of a sub-pixel area of an OLED device, and FIG. 6 which is a schematic cross-sectional view of a pixel area including a driving thin film transistor, an organic light-emitting diode device 100 includes a first substrate 110 and a second substrate 160 that is opposite to the first substrate 110, and a light-emitting diode E is disposed between the first and second substrates 110 and 160. Seal patterns 170 are formed in the edge portions of the first and second substrates 110 and 160, and the first and second substrates 110 and 160 are bonded by the seal patterns 170.

Figure 1:
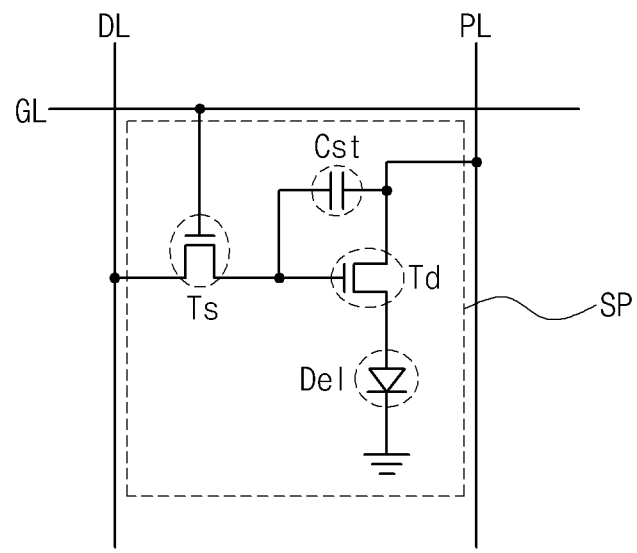
FIG. 1 is a circuit diagram showing a sub-pixel area of the related art organic light-emitting display (OLED) device.
Figure 2:
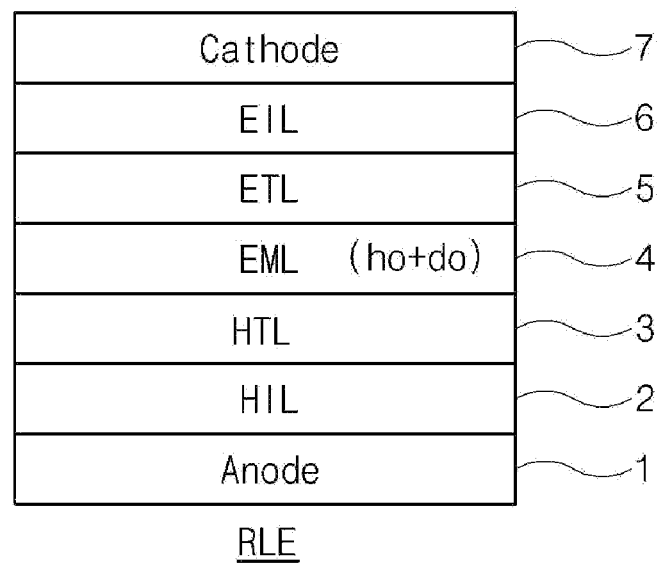
FIG. 2 is a cross-sectional view of a red light-emitting diode in the related art.
Figure 3A:
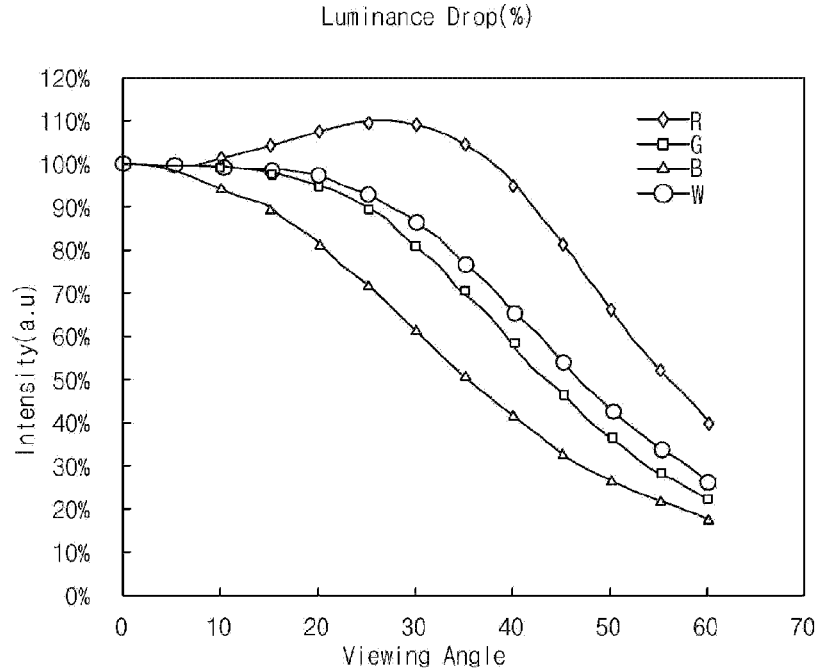
FIG. 3A is a graph showing changes in luminance with respect to viewing angles of light-emitting materials corresponding to red, green, blue, and white colors, respectively.
Figure 3B:
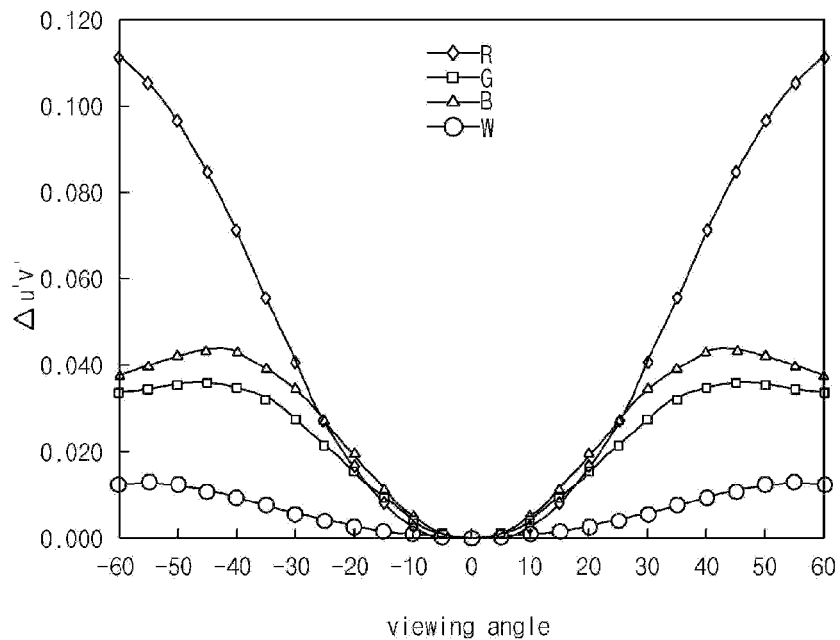
FIG. 3B is a graph showing color changes with respect to viewing angles of the light-emitting materials corresponding to red, green, blue, and white colors, respectively.
Figure 3C:
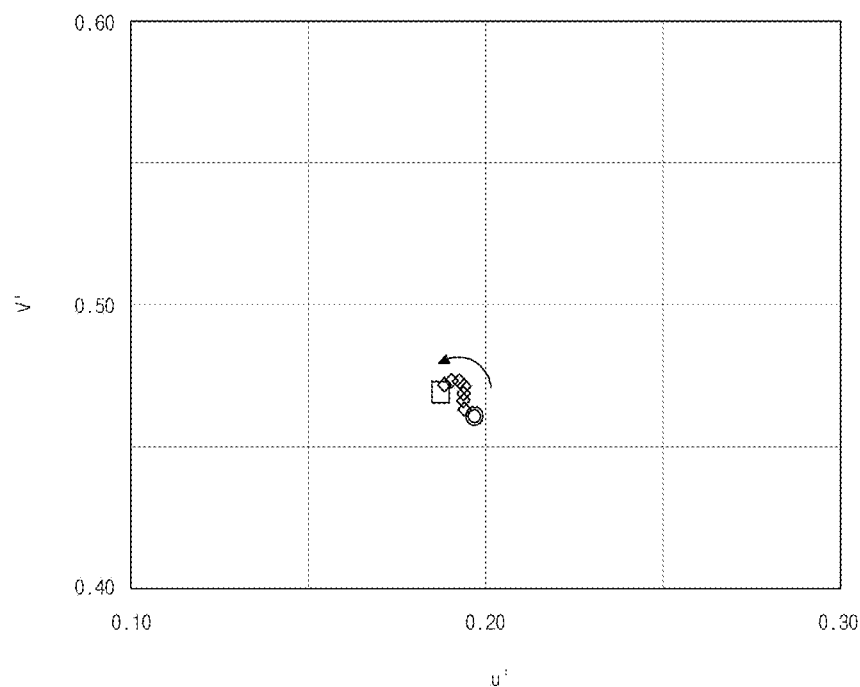
FIG. 3C is a graph showing changes in luminance of white color according to viewing angles when a short-wavelength red light-emitting material is used.
Figure 4:
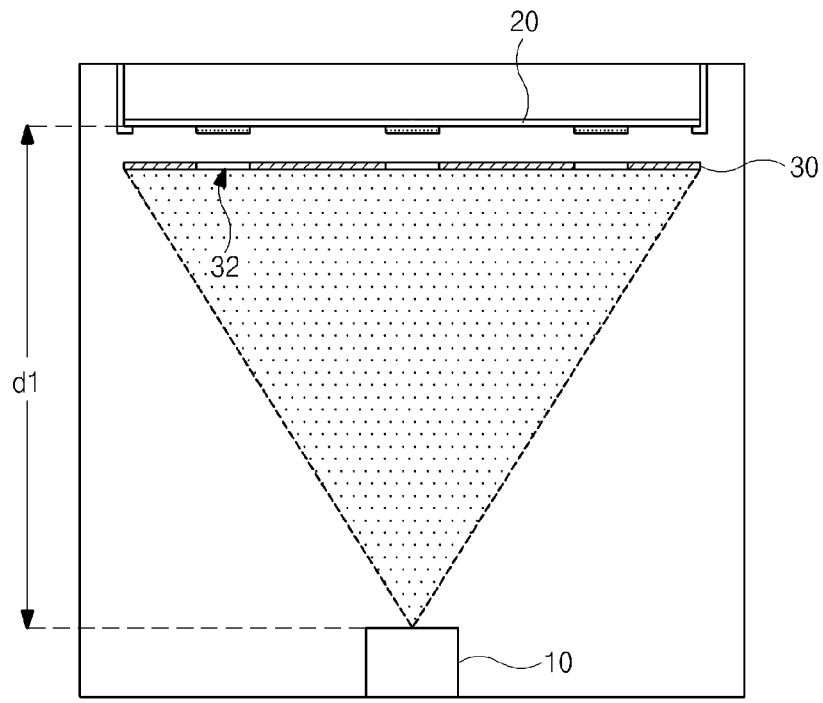
FIG. 4 is a schematic cross-sectional view of a deposition apparatus used in a conventional thermal deposition method.

In more detail, the first substrate 110 is made of a transparent glass substance, flexible, transparent plastic, or a polymer film. On the first substrate 110, a switching thin film transistor (Ts of FIG. 1), a driving thin film transistor (Td of FIG. 1), and a storage capacitor (Cst of FIG. 1) are formed in each sub-pixel. A light-emitting diode E is connected to each driving thin film transistor Td.

At a location on which the driving transistor Td is to be formed, a semiconductor layer 113 is formed. The semiconductor layer 113 includes a first area 113a made of polysilicon and forming a channel, and second areas 113b formed in both sides of the first area 113a and doped with a high concentration of impurities. An insulating layer (not shown) made of a non-organic material, such as $SiO_2$ or $SiN_x$, may be formed between the semiconductor layer 113 and the first substrate 110. The reason of forming an insulating layer below the semiconductor layer 113 is to prevent the properties of the semiconductor layer 113 from deteriorating due to alkali ions emitted from the first substrate 110 upon crystallization of the semiconductor layer 113.

Also, a gate insulating film 116 is formed on the entire area of the first substrate 110 to cover the semiconductor layer 113, and a gate electrode 120 is formed on the gate insulating film 116 in correspondence to the first area 113a of the semiconductor layer 113.

Also, on the gate insulating film 116, a gate line (not shown) connected to the gate electrode 230 of the switching transistor (Ts of FIG. 1) and extending in one direction is formed. The gate electrode 120 and the gate line may be formed of a first metal material having low resistance, for example, a material selected from among aluminum (Al), an aluminum alloy (AlNd), copper (Cu), a copper alloy, molybdenum (Mo), and moly-titanium (MoTi).

Meanwhile, an interlayer insulting film 123 made of an insulating material (for example, $SiO_2$ or $SiN_x$ which is a non-organic insulting material) is formed on the gate electrode 120 and the gate line over the entire area of the first substrate 110. Semiconductor layer contact holes 125 are formed in the interlayer insulating film 123 and the gate insulating film 116 to expose the second areas 113b of the semiconductor layer 113.

Also, a data line (not shown) and a power line (not shown) are formed on the interlayer insulating film 123 including the semiconductor layer contact holes 125. The data line and the power line cross the gate line to define a sub-pixel area SP, and are formed of a second metal material which is at least one material selected from among aluminum (Al), an aluminum alloy (AlNd), copper (Cu), a copper alloy, molybdenum (Mo), moly-titanium (MoTi), chrome (Cr), and titanium (Ti). The power line may be formed on the layer (that is, the gate insulating film 116) on which the gate line is formed, and spaced apart from the gate line.

Source and drain electrodes 133 and 136 are formed on the interlayer insulating film 123. The source and drain electrodes 133 and 136 are spaced apart from each other, and contact the second areas 113b exposed through the semiconductor contact holes 125. The source and drain electrodes 133 and 136 are made of the same second metal material as the data line.

The semiconductor layer 113, the gate insulating film 116, the gate electrode 120, and the interlayer insulating layer 123 that are sequentially applied form a driving transistor Td together with the source and drain electrodes 133 and 136 spaced apart from each other.

Not shown in the drawing, a switching transistor having the same layered structure as the driving transistor Td is formed on the first substrate 110.

Meanwhile, a protection layer 140 having a drain contact hole 143 that exposes the drain electrode 136 of the driving thin film transistor Td is formed on the driving transistor Td.

Also, a first electrode 147 is formed on the protection layer 140, and contacts the drain electrode 136 of the driving transistor Td through the drain contact hole 143.

The first electrode 147 is made of a conductive material having a relatively great work function, and functions as an anode electrode. For example, the first electrode 147 may be made of a transparent conductive material, such as indium tin oxide (ITO), indium zinc oxide (IZO), indium tin zinc oxide (ITZO), or AlO3 doped ZnO (AZO). Also, the first electrode 147 may further include a reflective metal layer made of silver (Ag), aluminum (Al), platinum (Pt), chrome (Cr), or their alloys, in order to function as a reflection electrode.

Then, a bank 150 is formed in the boundary of the sub-pixel area SP on the first electrode 147. The bank 150 is made of an insulating material, specifically, an organic insulating material, for example, benzo cyclo butadiene (BCB), polyimide resin, or photo acryle. The bank 150 may overlap the edge of the first electrode 147 in a manner to surround the sub-pixel area SP.

An organic light-emitting layer 155 is formed on the first electrode 147 in the sub-pixel area SP surrounded by the bank 150. The organic light-emitting layer 155 may be formed in organic thin film patterns of red (R), green (G), and blue (B) colors, and have a multi-layered structure in order to improve luminous efficiency.

For example, the organic light-emitting layer 155 may include a hole injecting layer (HIL), a hole transporting layer (HTL), an emission material layer (EML), an electron transporting layer (ETL), and an electron injecting layer (EIL).

A second electrode 158 is formed on the light-emitting material layer 155 and the bank 150.

The second electrode 158 is made of a conductive material having a relatively small work function in order to function as a cathode electrode. The second electrode 158, which is a semi-transparent electrode, may be made of an alloy (Mg:Ag) consisting of magnesium (Mg) and silver (Ag), or a material selected from among silver (Ag), aluminum (Al), aurum (Au), platinum (Pt), chrome (Cr), and their alloys. Preferably, the second electrode 158 may be formed with a thickness capable of achieving a reflectance of 5% or more and a transmittance of 50%.

The first electrode 147, the second electrode 158, and the organic light-emitting layer 155 interposed between the first electrode 147 and the second electrode 158 form a light-emitting diode E.

If a voltage is applied to the first and second electrodes 147 and 158, holes and electrons emitted from the first and second electrodes 147 and 158 move to the organic light-emitting layer 155 so that light is emitted from the organic light-emitting layer 155.

As described above, the first electrode 147 functions as a reflection electrode that reflects light, and the second electrode 158 functions as a semi-transparent electrode that transmits a part of light and reflects the remaining part of the light.

Accordingly, a part of light emitted from the organic light-emitting layer 155 passes through the second electrode 158 and is displayed to the outside, and the remaining part of the light emitted from the organic light-emitting layer 155 returns to the first electrode 147 without passing through the second electrode 158.

In other words, light is repeatedly reflected between the second electrode 158 and the first electrode 147 functioning as a reflection layer, which is called a micro cavity phenomenon.

That is, in the current embodiment, an optical resonance phenomenon of light is used to increase luminous efficiency and adjust luminescence purity of the light-emitting diode E.

Meanwhile, it is also possible that the first electrode 147 is formed as a semi-transparent electrode, and the second electrode 158 is formed as a reflection electrode.

As described above, the light-emitting diode E includes the first electrode 147, the second electrode 158, and the organic light-emitting layer 155 interposed between the first and second electrodes 147 and 158, and if the driving transistor Td is turned on, a gray scale is implemented according to the level of current flowing through the light-emitting diode E.

The organic light-emitting layer 155 may include first, second, and third light-emitting patterns emitting, for example, red light, green light, and blue light, in correspondence to sub-pixel areas SP.

According to an embodiment, the light-emitting diode E including the organic light-emitting layer 155 emitting red light, that is, a red light-emitting diode RE uses a host and first and second dopants to emit red light.

Light emitted from the first and second dopants is not destructed and constructed by light interference due to the resonance phenomenon of light so that a wavelength band of light is emitted.

For example, light corresponding to an intermediate wavelength between two wavelengths corresponding to the peak values of the PL spectrums of the first and second dopants is emitted.

For this, the emitting material layer of the red light-emitting diode RE includes the first and second dopants, and the distance between the first and second electrodes 147 and 158 is adjusted.

The first and second dopants may be classified according to the properties of EL and PL spectrums.

In detail, the first dopant is a short-wavelength dopant in which the peak value of its PL spectrum appears at a shorter wavelength than the peak value of its EL spectrum, and the second dopant is a long-wavelength dopant in which the peak value of its PL spectrum appears at a longer wavelength than the peak value of its EL spectrum.

Also, the distance between the first and second electrodes 147 and 158 is adjusted in correspondence to an intermediate wavelength between two wavelengths corresponding to the peak values of the PL spectrums of the first and second dopants.

Hereinafter, the red light-emitting diode RE will be described in more detail with reference to FIG. 7.

Figure 7:
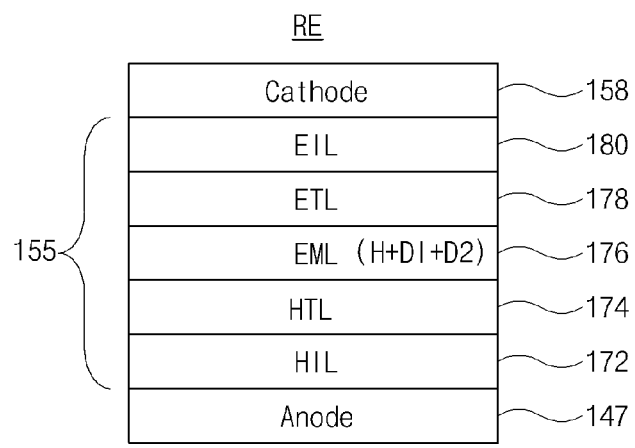
FIG. 7 is a cross-sectional view of a red light-emitting diode (RE) according to an embodiment of the present invention.

FIG. 7 is a cross-sectional view of a red light-emitting diode RE according to an embodiment of the present invention.

As shown in FIG. 7, the red light-emitting diode RE may include a first electrode 147, an organic light-emitting layer 155, and a second electrode 158. The first electrode 147, the organic light-emitting layer 155, and the second electrode 158 are sequentially applied.

The organic light-emitting layer 155 includes a hole injecting layer (HIL) 172, a hole transporting layer (HTL) 174, an emitting material layer (EML) 176, an electron transporting layer (ETL) 178, and an electron injecting layer (EIL) 180, which have been sequentially applied.

Any one of the hole injecting layer (HIL) 172, the hole transporting layer (HTL) 174, the electron transporting layer (ETL) 178, and the electron injecting layer (EIL) 180 may be omitted.

Although not shown in FIG. 7, a capping layer for increasing light extraction efficiency may be further formed on the second electrode 158.

The first electrode 147 may be an anode electrode, and the second electrode 158 may be a cathode electrode.

As described above, the first electrode 147 is a reflection electrode, and may include a reflective metal layer made of silver (Ag), aluminum (Al), aurum (Au), platinum (Pt), chrome (CR), or their alloys.

Also, the first electrode 147 may further include a transparent conductive material layer made of a material having a high work function, such as indium tin oxide (ITO), indium zinc oxide (IZO) or $Al_2O_3$ doped ZnO (AZO), on the upper or lower surface of the reflective metal layer.

The second electrode 158, which is a semi-transparent electrode, may be made of an alloy (Mg:Ag) consisting of magnesium (Mg) and silver (Ag). Or, the second electrode 158 may be made of a metal selected from among silver (Ag), aluminum (Al), aurum (Au), platinum (Pt), and chrome (Cr), or of an alloy containing such a metal. Preferably, the second electrode 158 may be formed with a thickness capable of achieving a reflectance of 5% or more and a transmittance of 50%.

As such, by configuring the first electrode 147 as a reflection electrode and the second electrode 158 as a semi-transparent electrode to obtain micro cavity, it is possible to increase light output efficiency and improve color definition.

Also, in the current embodiment, the distance between the first and second electrodes 147 and 158 is adjusted in correspondence to an intermediate wavelength between two wavelengths corresponding to the peak values of the PL spectrums of the first and second dopants D1 and D2 used in the emitting material layer (EML) 176. This will be described in detail after the first and second dopants D1 and D2 of the emitting material layer (EML) 176 are described.

The hole injecting layer (HIL) 172 functions to facilitate injection of holes. The hole injecting layer (HIL) 172 may be formed of at least one material selected from a group consisting of copper phthalocyanine (CuPc), poly(3,4)-ethylenedioxythiophene (PEDOT), polyaniline (PANI), and NPD (N,N-dinaphthyl-N,N'-diphenyl benzidine).

The hole transporting layer (HTL) 174 functions to facilitate transportation of holes. The hole transporting layer (HTL) 174 may be formed of at least one material selected from a group consisting of NPD (N,N-dinaphthyl-N,N'-diphenyl benzidine), TPD (N,N'-bis-(3-methylphenyl)-N,N'-bis(phenyl)-benzidine), s-TAD and MTDATA (4,4',4"-Tris(N-3-methylphenyl-N-phenyl-amino)-triphenylamine).

The electron transporting layer (ETL) 178 functions to facilitate transportation of electrons. The electron transporting layer (ETL) 178 may be formed of at least one material selected from a group consisting of Alq3, PBD, TAZ, Spiro-PBD, BAlq, and SAlq.

The electron injecting layer (EIL) 180 functions to facilitate injection of electrons. The electron injecting layer (EIL) 180 may be formed of at least one material selected from a group consisting of Alq3, PBD, TAZ, LiF, spiro-PBD, BAlq, and SAlq.

The emitting material layer (EML) 176 may include a host H and first and second dopants D1 and D2. The emitting material layer (EML) 176 may include a material emitting a red color, and contain a phosphorescent material or a fluorescent material.

For example, carbazole biphenyl (CBP) or mCP (1,3-bis (carbazol-9-yl)) may be used as a host material.

The first and second dopants D1 and D2 may be, as described above, classified according to the properties of their EL and PL spectrums. For example, the first dopant D1 has a property in which the peak value of its PL spectrum appears at a shorter wavelength than the peak value of its EL spectrum, and the second dopant D2 has a property in which the peak value of its PL spectrum appears at a longer wavelength than the peak value of its EL spectrum.

Hereinafter, PL and EL spectrums are described.

The PL spectrum represents intensity with respect to wavelengths of light emitted from a light-emitting material that emits light by light stimulus from the outside.

In detail, the light-emitting material, for example, a phosphorescent material or a fluorescent material itself emits light by light stimulus. That is, a light-emitting material absorbs light from the outside and again emits the light, which is called photoluminescence.

That is, the PL spectrum represents intensity distribution with respect to light wavelengths, obtained by analyzing the wavelengths of light emitted from a light-emitting material itself.

The EL spectrum represents intensity distribution with respect to light wavelengths emitted from a light-emitting material of a light-emitting diode E when a voltage is applied to the first and second electrodes of the light-emitting diode E.

In detail, when a forward voltage is applied to the light-emitting diode E, holes from the first electrode 147 which is an anode electrode, are injected to a highest occupied molecular orbital (HOMO) of the organic layer, and electrons from the second electrode 158 which is a cathode electrode, are injected to a lowest unoccupied molecular orbital (LUMO) of the organic layer. By the recombination energy of the injected electrons and holes, the organic molecules of the emitting material layer (EML) 176 are excited to generate excitons. The excitons are transferred to the bottom state through several paths to thereby emit light, which is called electroluminescence.

The EL spectrum represents intensity distribution with respect to light wavelengths, obtained by measuring and analyzing the components of light generated upon electroluminescence of a light-emitting material.

The EL spectrum may be measured using an optical spectra multichannel analyzer (OSMA).

Hereinafter, first and second dopants D1 and D2 according to an embodiment of the present invention will be described in more detail with reference to FIGS. 8 and 9.

Figure 8:
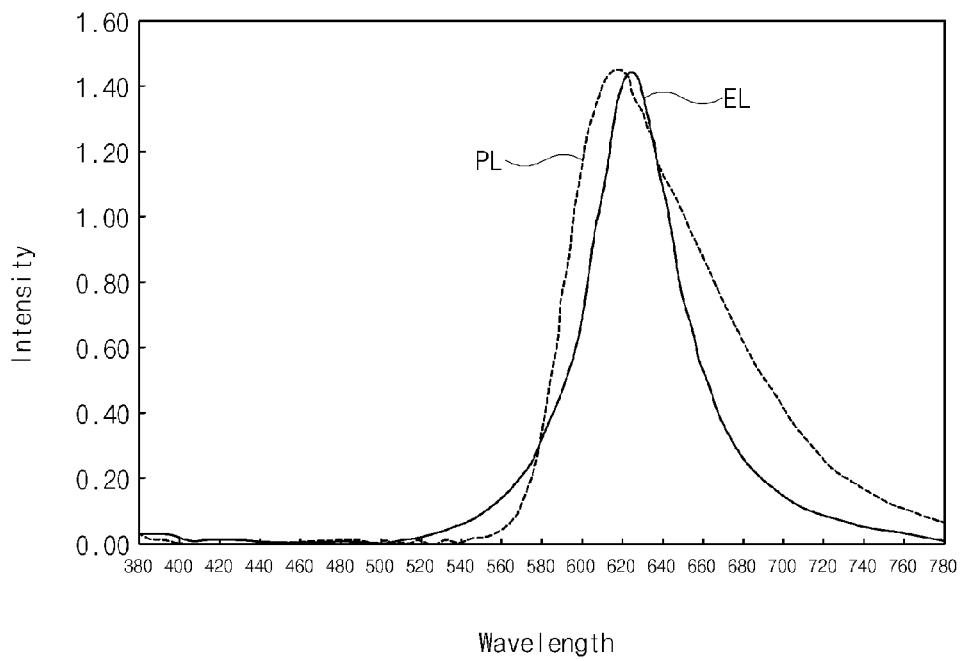
FIG. 8 is a graph showing an electro luminescence (EL) spectrum and a photo luminescence (PL) spectrum of a first dopant D1.
Figure 9:
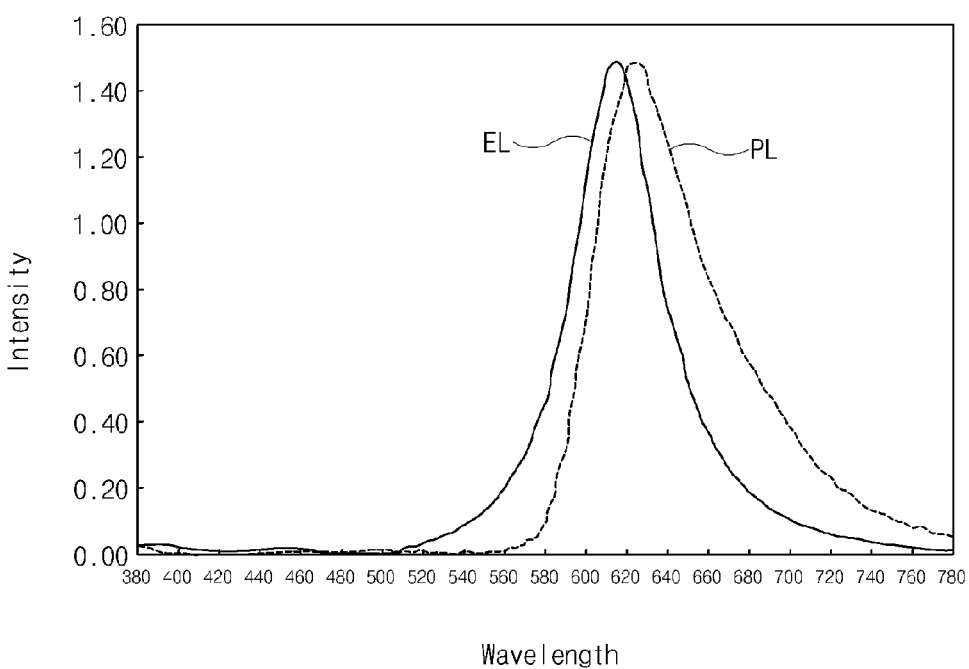
FIG. 9 is a graph showing an electro luminescence (EL) spectrum and a photo luminescence (PL) spectrum of a second dopant D2.

FIG. 8 is a graph showing the EL and PL spectrums of the first dopant D1, and FIG. 9 is a graph showing the EL and PL spectrums of the second dopant D2. In FIGS. 8 and 9, the horizontal axis represents light wavelengths, and the vertical axis represents light intensity with respect to the light wavelengths.

In the case of the first dopant D1, as shown in FIG. 8, a wavelength at which its PL spectrum reaches a peak value (that is, a greatest intensity) is shorter than a wavelength at which its EL spectrum reaches a peak value (that is, a greatest intensity).

For example, the peak value of the EL spectrum of the first dopant D1 appears at about 630 nm, and the peak value of the PL spectrum of the first dopant D1 appears at about 610 nm. That is, the peak value of the PL spectrum of the first dopant D1 appears at a shorter wavelength than the peak value of its EL spectrum.

Meanwhile, in the case of the second dopant D2, as shown in FIG. 9, a wavelength at which its PL spectrum reaches a peak value (that is, a greatest intensity) is longer than a wavelength at which its EL spectrum reaches a peak value (that is, a greatest intensity).

For example, the peak value of the EL spectrum of the second dopant D2 appears at about 610 nm, and the peak value of the PL spectrum of the second dopant D2 appears at about 620 nm. That is, the peak value of the PL spectrum of the second dopant D2 appears at a longer wavelength than the peak value of its EL spectrum.

That is, the first and second dopants D1 and D2 used in the emitting material layer (EML) 176 are materials that are selected in correspondence to the peak values of EL and PL spectrums. The first dopant D1 is a light-emitting material in which the peak value of its EL spectrum appears at a longer wavelength than the peak value of its PL spectrum, and the second dopant D2 is a light-emitting material in which the peak value of its EL spectrum appears at a shorter wavelength than the peak value of its PL spectrum.

The red light-emitting diode RE emits light corresponding to an intermediate wavelength between two wavelengths corresponding to the peak values of the PL spectrums of the first and second dopants D1 and D2, using a construction effect due to interference of light, without deconstructing light emitted by the first and second dopants D1 and D2.

This will be described in more detail with reference to FIG. 10, below.

Figure 10:
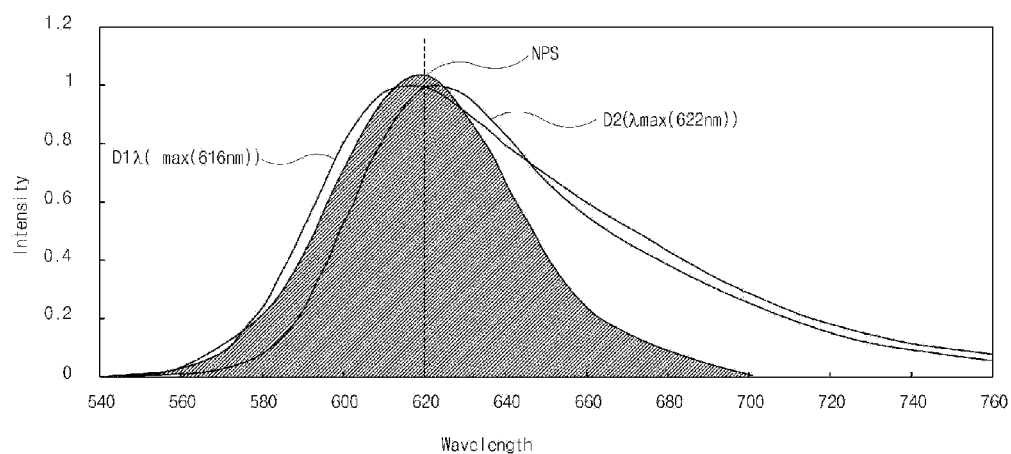
FIG. 10 is simulation results showing the PL spectrums of the first and second dopant D1 and D2, and a PL spectrum NPS newly created in a region where the PL spectrums overlap.

FIG. 10 is simulation results showing the PL spectrums of the first and second dopants D1 and D2, and a PL spectrum NPS newly created in a region where the PL spectrums overlap.

As shown in FIG. 10, the wavelength of the peak value of the PL spectrum of the first dopant D1 is 616 nm, and the wavelength of the peak value of the PL spectrum of the second dopant D2 is 622 nm.

The wavelength of the peak value of the EL spectrum of the first dopant D1 is longer than 616 nm, and the wavelength of the peak value of the EL spectrum of the second dopant D2 is shorter than 622 nm.

In this case, a PL spectrum NPS whose peak value corresponds to an intermediate wavelength (for example, about 620 nm) between two wavelengths corresponding to the PL spectrums of the first and second dopants D1 and D2 is newly created.

This is because the wavelengths of light emitted from the first and second dopants D1 and D2 are not deconstructed and are constructed by micro cavity phenomenon, thereby emitting new light in a region where the wavelengths overlap.

At this time, since light emitted from the first and second dopants D1 and D2 has to be all irradiated without interfering with each other, the concentrations of the first and second dopants D1 and D2 have to be set to 10% or less. If the concentrations of the first and second dopants D1 and D2 are high, energy transfer between the first and second dopants D1 and D2 occurs due to the high concentrations, so that all light emitted from the first and second dopants D1 and D2 cannot be irradiated.

Hereinafter, for convenience of description, the intermediate wavelength between two wavelengths corresponding to the peak values of the PL spectrums of the first and second dopants D1 and D2 is simply referred to as an intermediate wavelength.

Hereinafter, the distance between the first and second electrodes 147 and 158 as shown in FIG. 7, according to an embodiment of the present invention, will be described.

Figure 11:
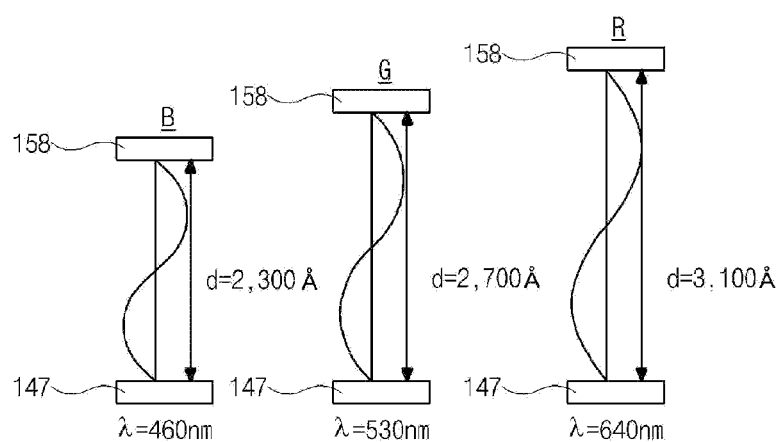
FIG. 11 shows examples of distances between first and second electrodes according to red, green, and blue wavelengths.

FIG. 11 shows examples of distances between the first and second electrodes 147 and 156 according to red, green, and blue color wavelengths. As described above, light is irradiated by micro cavity phenomenon based on resonance of light emitted from a light-emitting material between the first and second electrodes 147 and 158.

The distance between the first and second electrodes 147 and 158 is adjusted in correspondence to the wavelength of light (to have) to be irradiated.

For example, as shown in FIG. 11, in order to irradiate blue (B) color light, the distance between the first and second electrodes 147 and 158 is adjusted to 2300 Å in correspondence to the 4600 nm wavelength of blue (B) color light. Also, in order to irradiate green (G) color light, the distance between the first and second electrodes 147 and 158 is adjusted to 2700 Å in correspondence to the 530 nm wavelength of green (G) color light. Likewise, in order to irradiate red (R) color light, the distance between the first and second electrodes 147 and 158 is adjusted to 3100 Å in correspondence to the 640 nm wavelength of red (R) color light.

The distance between the first and second electrodes 147 and 158 of the red light-emitting diode (RE) is adjusted in correspondence to the intermediate wavelength.

Here, the intermediate wavelength may have an error between −10% and +10%.

In the case of the example of FIG. 10, since the intermediate wavelength of the first and second dopants D1 and D2 is 620 nm, the distance between the first and second electrodes 147 and 158 is adjusted in correspondence to the wavelength of 620 nm.

The distance between the first and second electrodes 147 and 158 is calculated by Equation 1, below:

$$(d_{org}) \times (n_{org}) + (d_{ITO}) \times (n_{ITO}) = \lambda/2m, \quad (1)$$

where ($d_{org}$) represents the distance between the first and second electrodes 147 and 158, and ($n_{org}$) represents the refraction index of the organic light-emitting layer 155 interposed between the first and second electrodes 147 and 158. m is a natural number. Also, ($d_{ITO}$) represents the thickness of the transparent conductive material layer formed on the reflective metal layer of the first electrode 147, ($n_{ITO}$) represents the refractive index of the transparent conductive material layer formed on the reflective metal layer of the first electrode 147, and λ represents a wavelength of a light-emitting region, for example, λ may be 620 nm which is the intermediate wavelength.

As described above, the red light-emitting diode RE is configured by including two dopants D1 and D2 in the emitting material layer (EML) 176 according to the properties of their EL and PL spectrums, and adjusting the distance between the first and second electrodes 147 and 158 in correspondence to the intermediate wavelength of the two dopants D1 and D2.

Thereby, the red light-emitting diode RE may have a new light-emitting area in which the PL spectrums of the first and second dopants D1 and D2 overlap. That is, the red light-emitting diode RE may have a new light-emitting area whose peak value appears at the intermediate wavelength.

Hereinafter, properties of the red light-emitting diode RE will be described with reference to FIGS. 12 and 13.

Table 1 shows a driving voltage Volt, current density mA/cm$^2$, efficiency with respect to current (luminosity) (cd/A), power efficiency (lm/W), and color coordinate (CIE_x and CIE_y) of the red light-emitting diode RE when one of dopants A and B is used in the emitting material layer (EML) 176, and when both the dopants A and B are used in the emitting material layer (EML) 176.

luminous efficiency that is lower than when only dopant A is used but higher than when only dopant B is used.

This will be described with reference to FIG. 12, below. FIG. 12 shows change paths of white in a color coordinator when the dopant A of Table 1 is used and when the dopant B of Table 1 is used, and a change path of white in the color coordinator when dopants A and B are used together.

Figure 12:
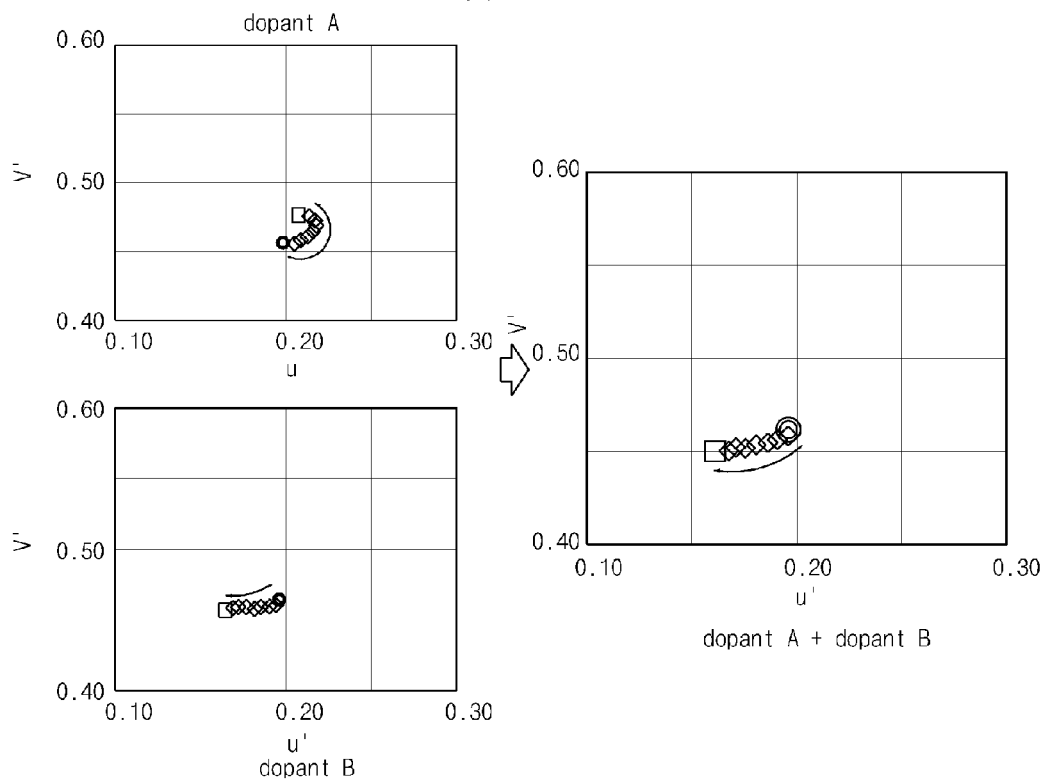
FIG. 12 shows change paths of white in a color coordinator when a dopant A of Table 1 is used and when a dopant B of Table 1 is used, and a change path of white in the color coordinator when the dopants A and B are used together.

In FIG. 12, the horizontal axes represent u values of the color coordinator, and the vertical axes represent v values of the color coordinator.

First, in a color coordinator, white color shows a good change in luminance with respect to viewing angles as it moves in a left and down direction.

As shown in FIG. 12, in the case of dopant B, a change in luminance of white with respect to viewing angles gradually moves in a left and down direction along one direction. In other words, dopant B has a good change in luminance with respect to viewing angles although it has low luminous efficiency.

Meanwhile, in the case of dopant A, a change in luminance of white with respect to viewing angles gradually moves in a right and up position, and then moves in a right and up direction while making a curve. In other words, dopant A has a poor change in luminance with respect to viewing angles although it has high luminous efficiency.

However, according to an embodiment of the present invention, when dopants A and B are used together, a change in luminance with respect to viewing angles gradually moves in the left and down position along one direction, like dopant B.

TABLE 1

|  | EML | Volt | Ma/cm$^2$ | Cd/A | lm/W | CIE_x | CIE_y |
| --- | --- | --- | --- | --- | --- | --- | --- |
| Comparative | Dopant A_5% | 4.2 | 4.6 | 41.0 | 31.1 | 0.658 | 0.340 |
| example | Dopant B_5% | 4.3 | 5.4 | 35.8 | 25.9 | 0.656 | 0.341 |
| Embodiment A | Dopant A 2% + Dopant B 2% | 4.2 | 4.5 | 42.6 | 32.2 | 0.659 | 0.338 |
| Embodiment B | Dopant A 1% + Dopant B 3% | 4.2 | 4.6 | 41.6 | 31.4 | 0.658 | 0.340 |
| Embodiment C | Dopant A 0.5% + Dopant B 3.5% | 4.2 | 4.8 | 39.8 | 29.7 | 0.660 | 0.338 |

Dopant A is a short-wavelength light-emitting material in which the peak value of its EL spectrum appears at a longer wavelength than the peak value of its PL spectrum, and dopant B is a long-wavelength light-emitting material in which the peak value of its EL spectrum appears at a shorter wavelength than the peak value of its PL spectrum.

The comparative example corresponds to the case where only the dopant A or B of 5% is used. Embodiment A corresponds to the case where the dopant A of 2% and the dopant B of 2% are used, embodiment B corresponds to the case where the dopant A of 1% and the dopant B of 3% are used, and embodiment C corresponds to the case where the dopant A of 0.5% and the dopant B of 3.5% are used.

First, as shown in the comparative example of Table 1, efficiency with respect to current of dopant A which is a short-wavelength light-emitting material is 41 cd/A, and efficiency with respect to current of dopant B which is a long-wavelength light-emitting material is 35.8 cd/A. That is, efficiency with respect to current of dopant A is higher than that of dopant B.

Efficiency with respect to current of embodiment A is 42.6 cd/A, and efficiency with respect to current of embodiment B is 41.6 cd/A. The results show that embodiments A and B can obtain higher luminous efficiency than when only the dopant A of 5% having high luminous efficiency is used.

Efficiency with respect to current of embodiment C is 39.8 cd/A, and the results show that embodiment C can obtain In other words, when dopants A and B are used together, it is possible to obtain excellent luminous efficiency and an excellent change in luminance of white with respect to viewing angles.

Figure 13:
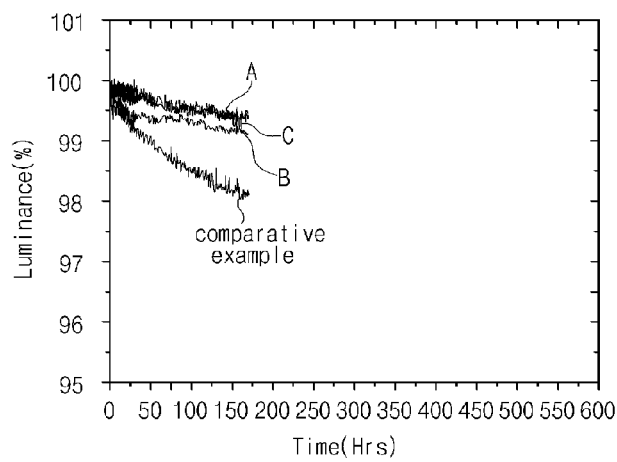
FIG. 13 shows simulation results of measured life spans of red light-emitting diodes when only the dopant B is used and when dopants of embodiments A, B, and C of Table 1 are used.

FIG. 13 shows simulation results of measured life spans of red light-emitting diodes when only dopant B is used, and when dopants of embodiments A, B, and C of Table 1 are used. In FIG. 13, the horizontal axis represents time, and the vertical axis represents luminance.

As shown in FIG. 13, in the cases of embodiments A, B, and C, a time for which the corresponding red light-emitting diodes (RE of FIG. 5) can emit light with a predetermined level of luminance, for example, luminance of about 99% or more, is about 150 hours or more, however, when only dopant B is used, a time for which the corresponding red light-emitting diode RE can emit light with luminance of about 99% or more, is about 50 hours.

As such, when dopants A and B are together used to form the light-emitting material layer (EML) 176, lift space of the red light-emitting diode RE can significantly increase.

As described above, the red light-emitting diode RE according to the embodiment of the present invention forms a light-emitting layer using two dopants. The two dopants are classified according to the properties of their PL and EL spectrums.

Also, the first and second electrodes 147 and 158 (see FIG. 7) are formed in correspondence to the intermediate wavelength of the PL spectrums of the two dopants, so that a new light-emitting region appears in a region where the PL spectrums of the two dopants overlap, due to resonance of light.

Accordingly, the red light-emitting diode RE has high luminous efficiency, and enables a gradual change in luminance with respect to a viewing angle, which results in excellent luminous efficiency with respect to a viewing angle. Also, the red light-emitting diode RE has a long life span.

Meanwhile, the red light-emitting diode RE may be configured using first and second dopants having properties as follows.

When the first and second dopants are used together, by adjusting the distance between the first and second electrodes 147 and 158, light may be irradiated such that the peak value of its EL spectrum appears in correspondence to an intermediate wavelength between wavelengths corresponding to the peak values of the PL spectrums of the first and second dopants.

The wavelength corresponding to the peak value of the PL spectrum of the first dopant is shorter than the intermediate wavelength, and the wavelength corresponding to the peak value of the PL spectrum of the second dopant is longer than the intermediate wavelength.

By configuring the first and second dopants in this way, the first and second electrodes 147 and 158 are formed in correspondence to the intermediate wavelength between the wavelengths corresponding to the PL spectrums of the two dopants, so that a new light-emitting area appears in a region where the PL spectrums of the two dopants overlap.

Accordingly, the red light-emitting diode has high light-emitting efficiency, and enables a gradual change in luminance with respect to a viewing angle, which results in excellent luminous efficiency with respect to a viewing angle.

As described above, the emitting material layer (EML) 176 may be formed with the first and second dopants and a host. If only one dopant is used, there is a problem in that white color changes according to a viewing angle, due to mismatch between the PL spectrum of the dopant and the EL spectrum of the light-emitting diode. Therefore, by using another dopant, the problem may be overcome. That is, the first and second dopants having different luminescent spectrum peak values are used.

Meanwhile, the emitting material layer (EML) 176 may be formed using a first host having excellent hole mobility, a second host having excellent electron mobility, and a dopant. That is, the first host is a material whose hole mobility is higher than its electron mobility, and the second host is a material whose electron mobility is higher than its hole mobility. Thereby, holes and electrons in the organic light-emitting layer maintain their balance, which leads to improvement in luminous property.

According to an embodiment of the present invention, there is provided a deposition apparatus for fabricating a light-emitting diode, in which one of a substrate and a furnace which is a source, is fixed, and the other one moves horizontally to deposit a source material on the substrate.

The deposition apparatus will be described below.

Figure 14:
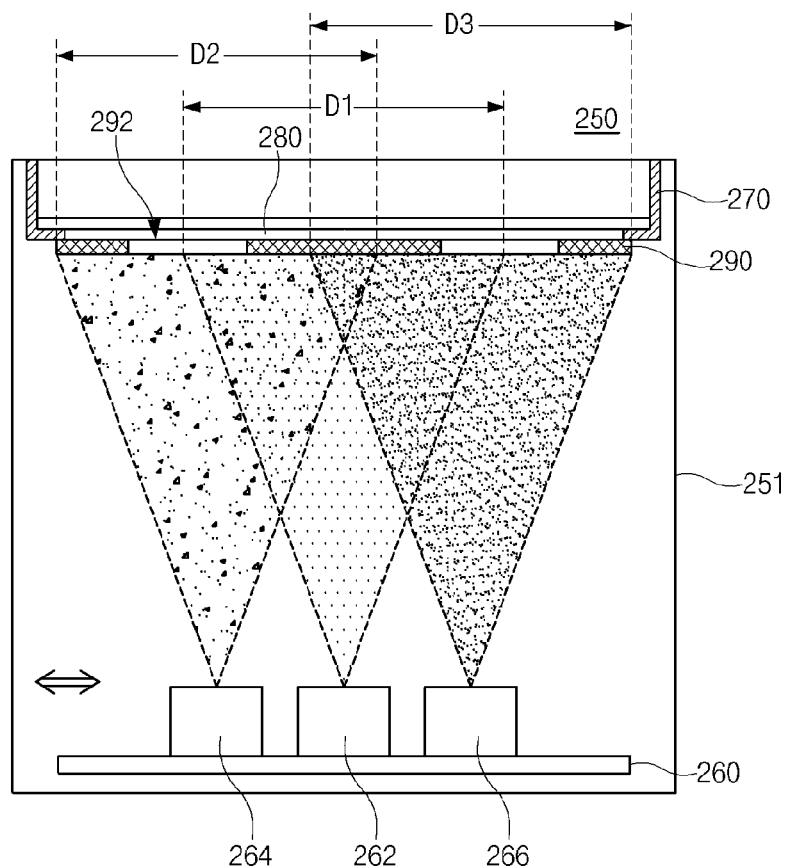
FIG. 14 is a cross-sectional view of a deposition apparatus for fabricating a light-emitting diode, according to an embodiment of the present invention.

FIG. 14 is a cross-sectional view of a deposition apparatus 250 for fabricating a light-emitting diode, according to an embodiment of the present invention.

As illustrated in FIG. 14, the deposition apparatus 250 includes a chamber 251 providing an internal space, first through third furnaces 262, 264, and 266 which are disposed in the chamber 251, and a substrate support 270 which is disposed above the first through third furnaces 262, 264, and 266 and configured to support a substrate 280.

For example, the first furnace 262 may store a dopant, and the second and third furnaces 264 and 266 may store first and second hosts. The second and third furnaces 264 and 266 are disposed in both sides of the first furnace 262. The first through third furnaces 262, 264, and 266 are heated by a heating device (not shown) to evaporate source materials stored in the first through third furnaces 262, 264, and 266 so that the source materials are deposited on the substrate 280.

The substrate support 270 supports the substrate 280 such that the substrate 280 maintains a predetermined distance from the bottom of the chamber 251. That is, in the embodiment of FIG. 14, the substrate 280 is spaced by a predetermined distance from the first through third furnaces 262, 264, and 266.

Also, a mask 290 having a plurality of openings is disposed between the substrate 280 and the first through third furnaces 262, 264, and 266, so that the materials evaporated from the first through third furnaces 262, 264, and 266 are deposited on the substrate 280 through the openings 292.

The first through third furnaces 262, 264, and 266 are positioned on a stage 260, and move horizontally according to movement of the stage 260. The substrate 280 is supported by the substrate support 270 and fixed.

That is, the deposition apparatus 250 for fabricating the light-emitting diode is a scan-type apparatus in which the first through third furnaces 262, 264, and 266 storing source materials move horizontally to deposit the source materials on a fixed substrate 280. The first through third furnaces 262, 264, and 266 may travel back and forth horizontally. However, it is also possible that the first through third furnaces 262, 264, and 266 are fixed and the substrate 280 moves horizontally such that source materials are deposited thereon.

In the deposition apparatus 250 for fabricating the light-emitting diode, having the above-described configuration, the first through third furnaces 262, 264, and 266 are positioned perpendicular to the surface of the substrate 280. That is, an imaginary line extending perpendicular to the upper surfaces of the first through third furnaces 262, 264, and 266 toward the substrate 280 is parallel to the direction of gravity.

Accordingly, the dopant and the first and second hosts evaporated from the first through third furnaces 262, 264, and 266 and deposited on the substrate 280 have different deposition regions. That is, the dopant evaporated from the first furnace 262 is deposited on a first deposition region D1, the first host evaporated from the second furnace 264 is deposited on a second deposition region D2, and the second host evaporated from the third furnace 266 is deposited on a third deposition region D3.

Since the first through third furnaces 262, 264, and 266 are arranged in the order of the second furnace 264, the first furnace 262, and the third furnace 266 in a first direction, when deposition is performed while the first through third furnaces 262, 264, and 266 move, a region where the first host of the second furnace 264 is deposited, a region where the first host of the second furnace 264 and the dopant of the first furnace 262 are deposited, a region where the first host of the second furnace 264 and the second host of the first and third furnaces 262 and 266 are deposited, a region where the second host of the first and third furnaces 262 and 266 is deposited, and a region where the second host of the third furnace 266 is deposited, are created. Also, if the first through third furnaces 262, 264, and 266 travel back and forth, deposition is performed in the reverse order.

That is, when the scan-type deposition apparatus is used to form a light-emitting material layer containing two kinds of hosts, a problem where the hosts are non-uniformly deposited is generated. Likewise, the problem is generated when two kinds of dopants and a host are used.

Figure 15:
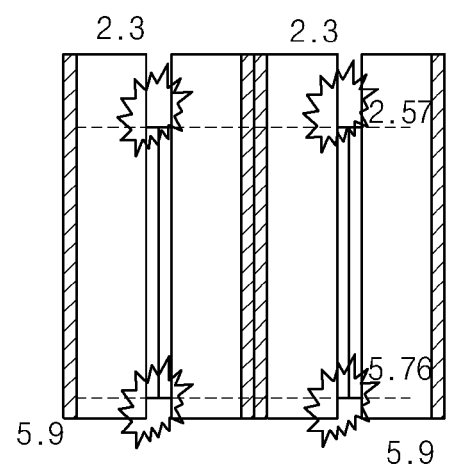
FIG. 15 shows energy levels in an emitting material layer deposited using the deposition apparatus for fabricating the light-emitting diode, according to the embodiment of the present invention.

Referring to FIG. 15 showing energy levels in the emitting material layer (EML) 176, when the first and second hosts and the dopant forming the emitting material layer (EML) 176 are non-uniformly deposited as described above, wells in which highest occupied molecular orbital (HOMO) and lowest unoccupied molecular orbital (LUMO) energy levels are different, are formed in the movement paths of holes and electrons. Accordingly, the wells interfere with movement of holes and electrons so that holes and electrons in the emitting material layer (EML) 176 are lateralized, which deteriorates device properties.

Figure 16:
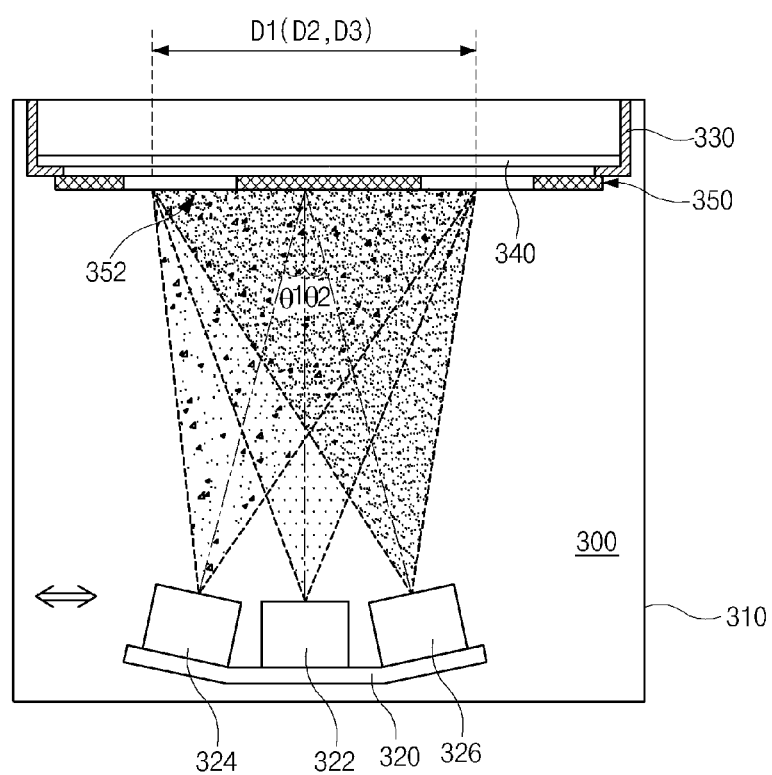
FIG. 16 is a cross-sectional view of a deposition apparatus for fabricating a light-emitting diode, according to another embodiment of the present invention.

FIG. 16 is a cross-sectional view of a deposition apparatus 300 for fabricating a light-emitting diode, according to another embodiment of the present invention.

Referring to FIG. 16, the deposition apparatus 300 includes a chamber 310 providing an internal space, first through third furnaces 322, 324, and 326 disposed in the chamber 310, and a substrate support disposed above the first through third furnaces 322, 324, and 326 and supporting a substrate 340.

For example, the first furnace 322 may store a dopant, and the second and third furnaces 324 and 326 may store first and second hosts. Since the dopant content is lower than the first and second host contents, the size of the first furnace 322 may be smaller than the sizes of the second and third furnaces 324 and 326.

However, it is also possible that the first furnace 322 stores a host, and the second third furnaces 324 and 326 store first and second dopants. In this case, the size of the first furnace 322 is larger than the sizes of the second and third furnaces 324 and 326.

The second and third furnaces 324 and 326 are disposed in both sides of the first furnace 322. The first through third furnaces 322, 324, and 326 are heated by a heating device (not shown), so that source materials stored in the first through third furnaces 322, 324, and 326 are evaporated and deposited on the substrate 340.

Also, the first furnace 322 is positioned perpendicular to the surface of the substrate 340, and the second and third furnaces 324 and 326 are positioned at predetermined angles with respect to the surface of the substrate 340. That is, an imaginary line extending perpendicular to the first furnace 322 toward the substrate 340 is parallel to the direction of gravity, an imaginary line extending perpendicular to the second furnace 324 toward the substrate 340 is at a first angle $\theta1$ with respect to the direction of gravity, and an imaginary line extending perpendicular to the third furnace 326 toward the substrate 340 is at a second angle $\theta2$ with respect to the direction of gravity. That is, imaginary lines extending vertically from the center parts of the first through third furnaces 322, 324, and 326 may reach a mask 350. For example, the first and second angles $\theta1$ and $\theta2$ may be in the range of about 3° to 50°, and the first angle $\theta1$ may be different from the second angle $\theta2$.

The first and second angles $\theta1$ and $\theta2$ are adjusted according to the distances between the second and third furnaces 324 and 326 and the substrate 340, and/or according to spraying angles of the second and third furnaces 324 and 326.

The substrate support 330 supports the substrate 340 in the upper space of the chamber 310 such that the substrate 340 maintains a predetermined distance from the bottom of the chamber 310. That is, the substrate support 330 enables the substrate 340 to be spaced by a predetermined distance from the first through third furnaces 322, 324, and 326.

Also, the mask 350 having a plurality of openings 352 is disposed between the substrate 340 and the first through third furnaces 322, 324, and 326, so that materials evaporated from the first through third furnaces 222, 224, and 226 are deposited on the substrate 240 through the openings 352.

The first through third furnaces 322, 324, and 326 are arranged on a stage 320, and move horizontally according to movement of the stage 320. The substrate 340 is supported by the substrate support 330 and fixed.

The stage 320 has a first part on which the first furnace 322 is disposed, and second and third parts on which the second and third furnaces 324 and 326 are disposed respectively, wherein the first part is positioned parallel to the bottom of the chamber 310, and the second and third parts are inclined at predetermined angles with respect to the bottom of the chamber 310. Accordingly, the second and third furnaces 324 and 326 are disposed at predetermined angles with respect to the substrate 340.

That is, the deposition apparatus 300 for fabricating the light-emitting diode is a scan-type apparatus in which the first through third furnaces 322, 324, and 326 storing source materials move horizontally to deposit the source materials on the fixed substrate 340. The first through third furnaces 322, 324, and 326 may travel back and forth horizontally. Alternatively, it is also possible that the first through third furnaces 322, 324, and 326 are fixed, and the fixed first through third furnaces 322, 324, and 326 deposit source materials on the substrate 340 moving horizontally.

As described above, in the deposition apparatus 300 for fabricating the light-emitting diode, an imaginary line extending perpendicular to the first furnace 322 toward the substrate 340 is parallel to the direction of gravity, an imaginary line extending perpendicular to the second furnace 324 toward the substrate 340 is at a first angle $\theta1$ with respect to the direction of gravity, and an imagery line extending perpendicular to the third furnace 326 toward the substrate 340 is at a second angle $\theta2$ with respect to the direction of gravity.

Accordingly, the dopant and the first and second hosts evaporated from the first through third furnaces 322, 324, and 326 and deposited on the substrate 340 have overlapping deposition regions. That is, the dopant evaporated from the first furnace 322 is deposited on a first deposition region D1, the first host evaporated from the second furnace 324 is deposited on a second deposition region D2, the second host evaporated from the third furnace 326 is deposited on a third deposition region D3, and the first through third deposition regions D1, D2, and D3 overlap each other.

In the deposition apparatus 300 for fabricating the light-emitting diode, the dopant of the first furnace 322 and the first and second hosts of the second and third furnaces 324 and 326 are uniformly deposited on the substrate 340 when the first through third furnaces 322, 324, and 326 move horizontally to perform deposition, since the second and third furnaces 324 and 326 are inclined such that the first through third deposition regions D1, D2, and D3 of the first through third furnaces 322, 324, and 326 overlap. Also, the first furnace 322 may store a host, and the second and third furnaces 324 and 326 may store first and second dopants, and in this case, likewise, uniformity of deposition can be achieved.

By depositing two kinds of hosts and a dopant using the scan-type deposition apparatus for fabricating the light-emitting diode to form an emitting material layer, it is possible to improve luminous efficiency and life span while preventing luminescence properties from deteriorating due to non-uniform deposition of source materials. Also, in the case of depositing two kinds of dopants having different properties and a host to form an emitting material layer, it is possible to prevent white color from changing according to a viewing angle while preventing luminescence properties from deteriorating due to non-uniform deposition of source materials.

Figure 17:
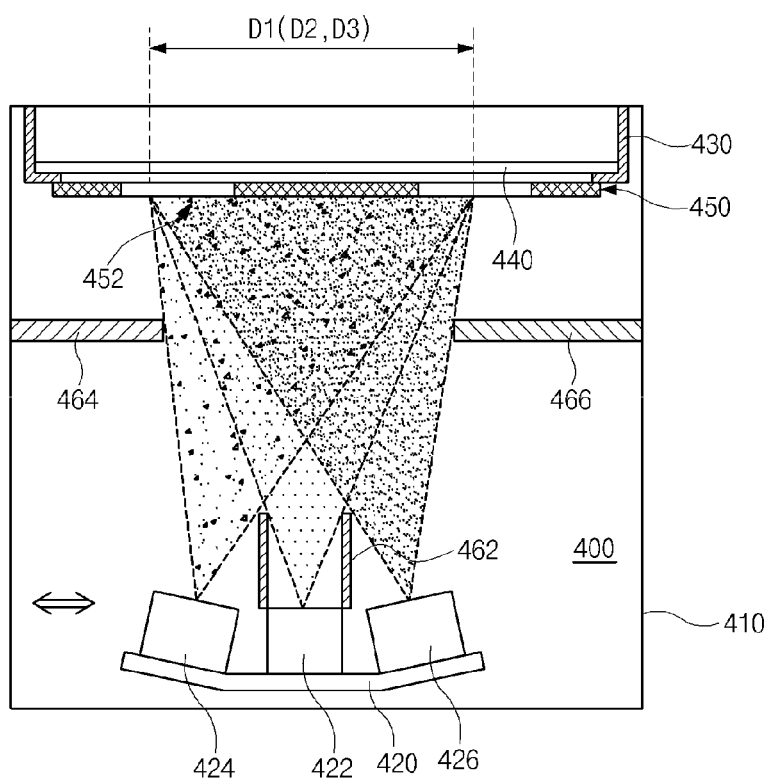
FIG. 17 is a cross-sectional view of a deposition apparatus for fabricating a light-emitting diode, according to another embodiment of the present invention.

FIG. 17 is a cross-sectional view of a deposition apparatus 400 for fabricating a light-emitting diode, according to another embodiment of the present invention.

As shown in FIG. 17, the deposition apparatus 400 for fabricating the light-emitting diode includes a chamber 410 providing an internal space, first through third furnaces 422, 424, and 426 disposed in the chamber 410, a substrate support 430 disposed above the first through third furnaces 422,424, and 426 and supporting a substrate 440, and first through third angle adjusting plates 462, 464, and 466 for adjusting angles at which source materials are evaporated from the first through third furnaces 422, 424, and 426.

For example, the first furnace 422 may store a host, and the second and third furnaces 424 and 426 may store first and second dopants. Since the host content is higher than the first and second dopant contents, the size of the first furnace 422 may be larger than the sizes of the second and third furnaces 424 and 426.

Also, it is possible that the first furnace 422 stores a dopant, and the second and third furnaces 424 and 426 store first and second hosts. In this case, the size of the first furnace 422 may be smaller than the sizes of the second and third furnaces 424 and 426.

The second and third furnaces 424 and 426 are disposed in both sides of the first furnace 422. The first through third furnaces 422, 424, and 426 are heated by a heating device (not shown), so that source materials stored in the first through third furnaces 422, 424, and 426 are evaporated and deposited on the substrate 440.

Also, the first furnace 422 is positioned perpendicular to the surface of the substrate 440, and the second and third furnaces 424 and 426 are positioned at predetermined angles with respect to the surface of the substrate 440. That is, an imaginary line extending vertically from the first furnace 422 toward the surface of the substrate 440 is parallel to the direction of gravity, an imaginary line extending vertically from the second furnace 424 toward the surface of the substrate 440 is at a first angle θ1 with respect to the direction of gravity, and an imaginary line extending vertically from the third furnace 426 toward the surface of the substrate 440 is at a second angle θ2 with respect to the direction of gravity. For example, the first and second angles θ1 and θ2 may be in the range of about 3° to 50°

The first and second angles θ1 and θ2 are adjusted according to the distances between the second and third furnaces 424 and 426 and the substrate 440, and/or according to spraying angles of the second and third furnaces 424 and 426.

The substrate support 430 supports the substrate 440 such that the substrate 440 maintains a predetermined distance from the bottom of the chamber 410. That is, in the embodiment of FIG. 17, the substrate 440 is spaced by a predetermined distance from the first through third furnaces 422, 424, and 426.

Also, a mask 450 having a plurality of openings 452 is disposed between the substrate 440 and the first through third furnaces 422, 424, and 426, so that materials evaporated from the first through third furnaces 422, 424, and 426 are deposited on the substrate 440 through the openings 452.

The first through third furnaces 422, 424, and 426 are positioned on a stage 420, and move horizontally according to movement of the stage 420. The substrate 440 is supported by the substrate support 430 and fixed.

The stage 420 has a first part on which the first furnace 422 is disposed, and second and third parts on which the second and third furnaces 424 and 426 are disposed respectively, wherein the first part is positioned parallel to the bottom of the chamber 410, and the second and third parts are inclined with respect to the first part. Accordingly, the second and third furnaces 424 and 426 are inclined with respect to the substrate 440.

The first angle adjusting plate 462 is disposed around the first furnace 422 to adjust the angle at which a material stored in the first furnace 422 is evaporated. That is, if the angle at which a material stored in the first furnace 422 is evaporated is too wide, the case where a deposition region D1 of the material evaporated from the first furnace 422 does not completely overlap deposition regions D2 and D3 of materials evaporated from the second and third furnaces 424 and 426 occurs. In this case, since a region in which only the material of the first furnace 422 is deposited is made, non-uniformity of deposition may occur. Accordingly, the first angle adjusting plate 462 is used to adjust the angle at which the material stored in the first furnace 422 is evaporated. As a result, the host stored in the first furnace 422 is deposited on the first deposition region D1.

The first angle adjusting plate 462 is protruded from the edge of the first furnace 422, in the direction of gravity. The first angle adjusting plate 462 may be formed horizontally in the entrance of the first furnace 422. However, by protruding the first angle adjusting plate 462 in the direction of gravity, angles at which materials stored in the second and third furnaces 424 and 426 arranged in both sides of the first furnace 422 are evaporated, can be adjusted together with the angle at which the material stored in the first furnace 422 is evaporated.

Also, the second angle adjusting plate 464 is disposed between the third furnace 426 and the substrate 440, and extends parallel to the bottom of the chamber 410. The second angle adjusting plate 464 may extend from the side wall of the chamber 410. The angle at which the material stored in the second furnace 424 is evaporated, is adjusted by the second angle adjusting plate 464 and the first angle adjusting plate 422, so that the first dopant of the second furnace 424 is deposited on the second deposition region D2 overlapping the first deposition area D1.

Also, the third angle adjusting plate 466 is disposed between the third furnace 426 and the substrate 440, and extends parallel to the bottom of the chamber 410. The third angle adjusting plate 466 may extend from the side wall of the chamber 410, and may be disposed symmetrically with the second angle adjusting plate 464. The angle at which the material stored in the third furnace 426 is evaporated, is adjusted by the third angle adjusting plate 466 and the first angle adjusting plate 422, so that the second dopant of the third furnace 426 is deposited on the third deposition region D3 overlapping the first and second deposition regions D1 and D2.

Meanwhile, if the first, second, and third deposition regions D1, D2, and D3 completely overlap without the first angle adjusting plate 462, only the second and third angle adjusting plates 464 and 466 may be provided without the first angle adjusting plate 462. However, it is also possible that only the first angle adjusting plate 462 is provided, or only one of the second and third angle adjusting plates 464 and 466 is provided together with the first angle adjusting plate 462.

As described above, in the deposition apparatus 400 for fabricating the light-emitting diode, the second and third furnaces 424 and 426 are disposed in both sides of the first furnace 422, with predetermined angles with respect to the first furnace 422, and the first through third angle adjusting plates 462, 464, and 466 for adjusting angles at which the materials stored in the first through third furnaces 422, 424, and 426 are evaporated, are provided.

Accordingly, the host and the first and second dopants evaporated from the first through third furnaces 422, 424, and 426 are deposited on overlapping deposition regions of the substrate 440. That is, the host evaporated from the first furnace 422 is deposited on the first deposition region D1, the first dopant evaporated from the second furnace 424 is deposited on the second deposition region D2, the second dopant evaporated from the third furnace 426 is deposited on the third deposition region D3, and the first through third deposition regions D1, D2, and D3 overlap.

In the deposition apparatus 400 for fabricating the light-emitting diode, the host of the first furnace 422 and the first and second dopants of the second and third furnaces 424 and 426 are uniformly deposited on the substrate 440 when the first through third furnaces 422, 424, and 426 move horizontally to perform deposition, since the second and third furnaces 424 and 426 disposed in both sides of the first furnace 422 are inclined such that the first through third deposition regions D1, D2, and D3 of the first through third furnaces 422, 424, and 426 overlap, and the first through third angle adjusting plates 462, 464, and 466 adjust angles at which the materials stored in the first through third furnaces 422, 424, and 426 are evaporated. Also, the first furnace 422 may store a dopant, and the second and third furnaces 424 and 426 may store first and second hosts, and in this case, likewise, uniformity of deposition can be achieved.

That is, by depositing two kinds of hosts having different properties and a dopant using the scan-type deposition apparatus for fabricating the light-emitting diode to form an emitting material layer, it is possible to improve luminous efficiency and life span while preventing luminescence properties from deteriorating due to non-uniform deposition of source materials. Also, in the case of depositing two kinds of dopants having different properties and a host to form an emitting material layer, it is possible to prevent white color from changing according to a viewing angle while preventing luminescence properties from deteriorating due to non-uniform deposition of source materials.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. A light-emitting diode comprising:
   a first electrode including a reflective metal layer and a transparent conductive material layer formed on the reflective metal layer;
   an emitting material layer formed on the first electrode and including a light-emitting layer formed with a host and first and second dopants; and
   a second electrode formed on the emitting material layer and being a semi-transparent electrode,
   wherein a first wavelength corresponding to a peak value of a photo luminescence (PL) spectrum of the first dopant is shorter than a second wavelength corresponding to a peak value of an electro luminescence (EL) spectrum of the first dopant, and a third wavelength corresponding to a peak value of a PL spectrum of the second dopant is longer than a fourth wavelength corresponding to a peak value of an EL spectrum of the second dopant,
   wherein the emitting material layer emits a light in one of a red color wavelength range, a green color wavelength range, a blue color wavelength range, and the first and second dopants each emits light in the one of the red color wavelength range, the green color wavelength range, the blue color wavelength range,
   wherein the distance between the first electrode and the second electrode is adjusted in correspondence to an intermediate wavelength between the first wavelength and the third wavelength, and
   wherein the second wavelength is longer than the fourth wavelength, and the first wavelength is shorter than the third wavelength.

2. The light-emitting diode of claim 1, wherein the equation for calculating the distance between the first electrode and the second electrode is as follows:

$$(d\text{org}) \times (n\text{org}) + (d\text{ITO}) \times (n\text{ITO}) = (\lambda/2) \times m,$$

where (dorg) represents the distance between the first electrode and the second electrode, (norg) represents a refraction index of the emitting layer, (dITO) represents the thickness of the transparent conductive material layer, (nITO) represents a refractive index of the transparent conductive material layer, $\lambda$ represents the intermediate wavelength, and m is a natural number.

* * * * *